(12) United States Patent
Lee et al.

(10) Patent No.: US 9,053,955 B2
(45) Date of Patent: Jun. 9, 2015

(54) NITRIDE SEMICONDUCTOR DEVICE AND METHOD OF MANUFACTURING THE SAME

(71) Applicant: Samsung Electronics Co., Ltd., Suwon-Si, Gyeonggi-Do (KR)

(72) Inventors: Moon-sang Lee, Seoul (KR); Sung-soo Park, Seongnam-si (KR); Dae-ho Yoon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/771,411

(22) Filed: Feb. 20, 2013

(65) Prior Publication Data

US 2014/0061587 A1 Mar. 6, 2014

(30) Foreign Application Priority Data

Sep. 5, 2012 (KR) .......................... 10-2012-0098485

(51) Int. Cl.
*H01L 29/06* (2006.01)
*H01L 29/12* (2006.01)
(52) U.S. Cl.
CPC .......... *H01L 29/0684* (2013.01); *H01L 29/122* (2013.01)
(58) Field of Classification Search
CPC ....................................................... H01L 33/32
USPC ............... 257/13–15, 62.55, 87, 95, E33.008; 438/29, 632
See application file for complete search history.

(56) References Cited

U.S. PATENT DOCUMENTS

| 2009/0090886 | A1* | 4/2009 | Wong et al. ................. 252/62.55 |
| 2011/0076791 | A1 | 3/2011 | Wu et al. |
| 2011/0306190 | A1 | 12/2011 | Kosaki et al. |
| 2012/0056152 | A1 | 3/2012 | Li et al. |
| 2012/0057392 | A1 | 3/2012 | Chrzan et al. |
| 2012/0061660 | A1 | 3/2012 | Lu et al. |
| 2012/0063481 | A1 | 3/2012 | Nagatomo |
| 2012/0068153 | A1 | 3/2012 | Seong et al. |
| 2012/0070576 | A1 | 3/2012 | Groenen et al. |
| 2012/0074384 | A1 | 3/2012 | Fan et al. |
| 2012/0074449 | A1 | 3/2012 | Park et al. |
| 2012/0080698 | A1 | 4/2012 | Chu et al. |
| 2012/0085410 | A1 | 4/2012 | Wang et al. |
| 2012/0086017 | A1 | 4/2012 | Hwang et al. |
| 2012/0086021 | A1 | 4/2012 | Wang |

(Continued)

FOREIGN PATENT DOCUMENTS

KR 20100043838 A 4/2010
KR 20110068413 A 6/2011

OTHER PUBLICATIONS

M.H. Lo, et al. "Defect selective passivation in GaN epitaxial growth and its application to light emitting diodes" Applied Physics Letters, vol. 95, pp. 211103-1-211103-3, 2009.

(Continued)

*Primary Examiner* — Mark A Laurenzi
(74) *Attorney, Agent, or Firm* — Harness, Dickey & Pierce, P.L.C.

(57) ABSTRACT

A nitride semiconductor device includes a dislocation control layer on a substrate, and a nitride semiconductor layer on the dislocation control layer. The dislocation control layer includes a nanocomposite of a first nanoparticle made of a first material and at least one second nanoparticle made of a second material.

19 Claims, 6 Drawing Sheets

(56) References Cited

U.S. PATENT DOCUMENTS

| | | |
|---|---|---|
| 2012/0090381 A1 | 4/2012 | Andersson |
| 2012/0091406 A1 | 4/2012 | Jang et al. |
| 2012/0097973 A1 | 4/2012 | Shi et al. |
| 2012/0103456 A1 | 5/2012 | Smith et al. |
| 2012/0104407 A1 | 5/2012 | Hung et al. |
| 2012/0107979 A1 | 5/2012 | Moon et al. |
| 2012/0112218 A1 | 5/2012 | Teng et al. |
| 2012/0129682 A1 | 5/2012 | Yun et al. |
| 2012/0187369 A1* | 7/2012 | Jeong et al. ............ 257/13 |

OTHER PUBLICATIONS

Qiming Li, et al. "Dislocation density reduction in GaN by dislocation filtering through a self-assembled monolayer of silica microspheres" Applied Physics Letters, vol. 94, pp. 231105-1-231105-3, (2009).

* cited by examiner

NITRIDE SEMICONDUCTOR DEVICE AND METHOD OF MANUFACTURING THE SAME

CROSS-REFERENCE TO RELATED APPLICATIONS

This application claims the benefit of Korean Patent Application No. 10-2012-0098485, filed on Sep. 5, 2012, in the Korean Intellectual Property Office, the disclosure of which is incorporated herein in its entirety by reference.

BACKGROUND

1. Field

Some example embodiments relate to nitride semiconductor devices and methods of manufacturing the nitride semiconductor devices, and more particularly, high-quality nitride semiconductor devices and methods of manufacturing the high-quality nitride semiconductor devices.

2. Description of the Related Art

The electronics industry using nitride semiconductors has drawn attention as one suitable for the development and growth of green industries. In particular, gallium nitride (GaN), a nitride semiconductor, is widely used in a light-emitting diode (LED) display device and a back-light device. In addition, an LED has relatively low power consumption and a relatively long lifetime, compared to conventional light bulbs or fluorescent lamps, and thus, the LED device is widely being used as a general lighting device instead of light bulbs or fluorescent lamps. GaN is widely used to manufacture a blue LED from among red, green, and blue LEDs, which are essential elements of high power electronic component devices including an LED, because a blue LED using GaN is more desirable in terms of brightness, lifespan, and internal quantum efficiency, compared to conventional blue LEDs using a semiconductor material, for example, zinc selenide (ZnSe), due to improved physical and chemical characteristics of GaN. Also, since GaN has a direct transition band gap structure and the band gap is adjustable in a range from about 1.9 eV to about 6.2 eV by using an indium (In) or aluminum (Al) alloy, semiconductor layers emitting green, blue, and white light may be manufactured by using GaN. That is, since an emission wavelength may be adjusted by the adjustment of the band gap, characteristics of a material may be customized to specific device characteristics.

For example, since a white LED that may replace a blue LED useful for optical recording and light bulbs may be made by using GaN, GaN is useful in light devices. Also, since GaN has a relatively high breakdown voltage and is stable at a relatively high temperature, GaN is useful in various fields such as high power devices and high temperature electronic devices. For example, GaN may be applied to a large electric board using a full color display, a traffic light, a light source of an optical recording medium, and a high power transistor of a vehicle engine.

SUMMARY

Some example embodiments provide nitride semiconductor devices that may control the occurrence of a dislocation due to an inconsistency in a lattice constant and a difference in a thermal expansion coefficient when a nitride semiconductor layer is grown on a heterogenous substrate. Some example embodiments also provide methods of manufacturing the nitride semiconductor devices.

Additional aspects will be set forth in part in the description which follows and, in part, will be apparent from the description, or may be learned by practice of the presented embodiments.

According to an example embodiment, a nitride semiconductor device includes a dislocation control layer on a substrate, and a nitride semiconductor layer on the dislocation control layer. The dislocation control layer includes a nanocomposite of a first nanoparticle made of a first material and at least one second nanoparticle made of a second material.

The first material may include an oxygen hydrogen (OH) ligand. The nanocomposite may include the at least one second nanoparticle coupled to the first nanoparticle. The first material may be any one of $SiO_2$ and ZnO. The second material may be any one of GaN and $\beta\text{-}Ga_2O_3$, and the at least one second nanoparticle may be coupled to a surface of the first nanoparticle.

The first nanoparticle may be a $SiO_2$ nanoparticle and the at least one second nanoparticle may be one of a GaN nanoparticle and a $\beta\text{-}Ga_2O_3$ nanoparticle coupled to the $SiO_2$ nanoparticle. The $SiO_2$ nanoparticle may have a size in a range of about 200 nm to about 3 μm. The substrate may include any one of a sapphire substrate, a silicon substrate, and a silicon carbide substrate.

The nitride semiconductor layer may include a first conductive type gallium nitride layer, an active layer having a gallium nitride-based multilayer quantum well structure, and at least one second conductive type gallium nitride layer having a type opposite to that of the first conductive type gallium nitride layer. The nitride semiconductor device may further include a first electrode on a surface of one of the first conductive type gallium nitride layer and the substrate and a second electrode on a surface of the at least one second conductive type gallium nitride layer, the first electrode and the second electrode configured to apply a current to generate light in the active layer.

A buffer layer may be a buffer layer between the substrate and the nitride semiconductor layer. The buffer layer may include at least one of ZnO, BN, AlN, GaN, and $Al_{1-x}Ga_xN$.

According to example embodiments, a method of manufacturing a nitride semiconductor device includes preparing a substrate, forming a dislocation control layer on a substrate, the forming a dislocation control layer including forming a nanocomposite including a first nanoparticle made of a first material and at least one second nanoparticle made of a second material, and growing a nitride semiconductor layer on the dislocation control layer using epitaxial growth.

Forming the dislocation control layer may include spin-coating a solution including the nanocomposite on the substrate to distribute the nanocomposite on the substrate. Preparing the substrate may include surface-treating the substrate to make a hydrophilic substrate. The substrate may be surface-treated for a given time using a solution obtained by mixing $H_2SO_4$, $H_2O_2$, and deionized water.

The solution may be spin-coated using any one of deionized water, ethanol, methanol, and toluene as a solvent. Forming the nanocomposite may include coupling the at least one second nanoparticle to a surface of the first nanoparticle, the at least one second nanoparticle including one of a GaN nanoparticle and a $\beta\text{-}Ga_2O_3$ nanoparticle and the first nanoparticle including a $SiO_2$ nanoparticle.

The coupling may include heat-treating the at least one $\beta\text{-}Ga_2O_3$ nanoparticle coupled to the surface of the $SiO_2$ nanoparticle to form a $SiO_2$ & $\beta\text{-}Ga_2O_3$ nanocomposite powder, and nitriding the heat-treated $SiO_2$ & $\beta\text{-}Ga_2O_3$ nanocomposite powder. The dislocation control layer may be formed using any one of gallium nitrate and gallium chloride as a solute to form the nanocomposite, and using any one of deionized water, ethanol, methanol, and propanol as a solvent to form the nanocomposite.

According to the nitride semiconductor device and the method, a high-quality nitride thin film, for example, a high-quality GaN thin film may be grown on a heterogenous substrate by including a dislocation control layer and may be applied to manufacture a horizontal or vertical nitride semiconductor light-emitting device.

That is, by forming the dislocation control layer by using nanocomposites (for example, $SiO_2$ & GaN nanocomposites) having a structure in which a second nanoparticle is coupled on the surface of a first nanoparticle, a nitride semiconductor device such as a horizontal or vertical nitride semiconductor light-emitting device, in which defects may be fundamentally removed, may be implemented. In this case, light efficiency of a light-emitting device may be represented with internal quantum efficiency and external quantum efficiency, and the internal quantum efficiency is determined according to a design or quality of an active layer and the control of defects that occur in a substrate, and thus, a light-emitting device having an improved internal quantum efficiency may be obtained.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Hereinafter, a nitride semiconductor device and a method of manufacturing the nitride semiconductor device will be described with regard to example embodiments with reference to the attached drawings. In the drawings, like reference numerals in the drawings denote like elements, and the thicknesses of layers and regions are exaggerated for clarity. Example embodiments are just examples and the disclosure is embodied in many different forms. Hereinafter, it will also be understood that when a layer is referred to as being "on" another layer or substrate, it can be directly on the other layer or substrate, or intervening layers may also be present. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper", "vertical", "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As widely known, a nitride (for example, GaN)-based device, for example, a nitride semiconductor light-emitting device, is generally implemented in a thin film form of a two dimensional structure. However, in the nitride semiconductor light-emitting device having a thin film form, defects may occur due to a difference in a lattice constant or a thermal expansion coefficient from a substrate during epitaxial growth.

Currently, a lateral epitaxial overgrowth (LEO) method and a Pendeo method are widely used as a method of reducing the dislocation density of a GaN thin film. The LEO method uses a principle in which GaN does not grow on $SiO_2$ or $Si_3N_4$. That is, the LEO method includes forming a pattern having a regular form on a sapphire substrate by using $SiO_2$ or $Si_3N_4$ and then growing a GaN epitaxial layer only in a portion in which the sapphire substrate is exposed. The Pendeo method includes growing a GaN epitaxial layer, forming a groove by etching a portion of a pattern after forming the pattern on the GaN epitaxial layer, and re-growing a GaN epitaxial layer on a resultant structure. Both of the two methods are methods of controlling that defects formed at an interface between a sapphire substrate and a GaN epitaxial layer moves to the surface of the GaN epitaxial layer by changing the direction of dislocation, which occurs during a process of growing the GaN epitaxial layer and is propagated to the surface, to the lateral side of the GaN epitaxial layer.

However, both of the methods include complex processes, such as forming a mask layer on a substrate, patterning the mask layer, and the like. In addition, in the above methods, a dry etching is mainly used to provide roughness or a flexion, and thus, defects, such as vacancies, impurities, dry etching residues, or physical damage, may occur on a semiconductor surface after the dry etching, thereby reducing device efficiency. Furthermore, a nonstoichiometric surface is formed due to the dry etching, and thus, device reliability may deteriorate and a device lifetime may be reduced.

A nitride semiconductor device, for example, a GaN semiconductor device according to an example embodiment, controls (removes or suppresses) the occurrence of a dislocation due to a lattice inconsistency and a thermal expansion coefficient difference between a heterogenous substrate and a nitride semiconductor, for example, GaN, by uniform distribution using nanocomposites of first and second nanoparticles that are different materials, for example, nanocomposites of $SiO_2$ nanoparticles and GaN nanoparticles on the heterogenous substrate. Thus, a high-quality epitaxial layer may be formed and a high-quality nitride semiconductor device, for example, a high-quality two dimensional light-emitting device, may be implemented by using the high-quality epitaxial layer.

In addition, according to a nitride semiconductor device and a method of manufacturing the nitride semiconductor device, according to example embodiments, the deterioration of the reliability of an epitaxial layer, which occurs when forming a mask layer on a substrate and etching the mask layer to pattern the epitaxial layer, may be prevented or reduced and process costs may be lowered.

Figure 1:
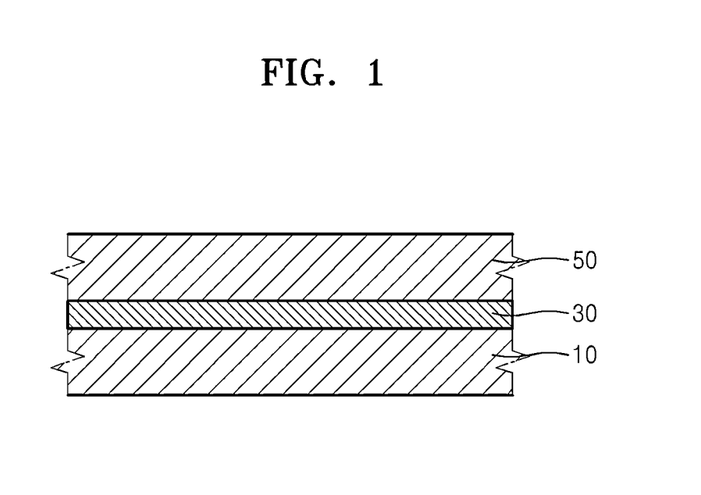
FIG. 1 is a cross-sectional view schematically illustrating a nitride semiconductor device according to an example embodiment.

FIG. 1 is a cross-sectional view schematically illustrating a nitride semiconductor device according to an example embodiment. Referring to FIG. 1, the nitride semiconductor device includes a substrate 10, a dislocation control layer 30 that is formed on the substrate 10, and a nitride semiconductor layer 50 that is formed on the dislocation control layer 30.

For example, the substrate 10 may be a conductive substrate and may be a substrate including a material that is different from that of the nitride semiconductor layer 50 to be formed by epitaxial growth. For example, the substrate 10 may be any one of a sapphire substrate, a silicon substrate, and a silicon carbide (SiC) substrate.

Figure 2:
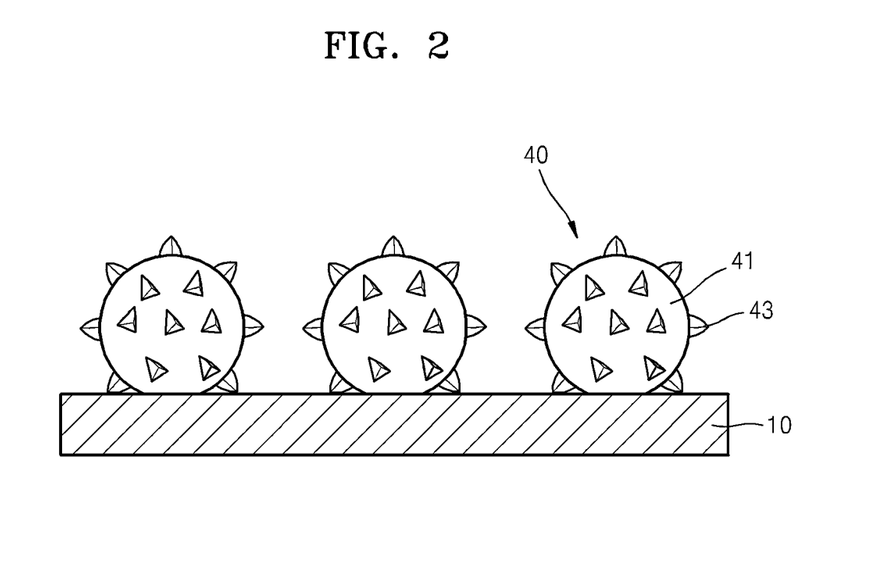
FIG. 2 is a diagram illustrating a magnification of a dislocation control layer of FIG. 1.

The dislocation control layer 30 controls (removes or suppresses) the occurrence of a dislocation due to a lattice inconsistency and a thermal expansion coefficient difference between the substrate 10 and the nitride semiconductor layer 50. The dislocation control layer 30 may include nanocomposites 40 of first nanoparticles 41 and second nanoparticles 43 that are different materials, as shown in FIG. 2. The nanocomposites 40 each may have a structure in which at least one second nanoparticle 43 is coupled to the surface of the first nanoparticle 41.

The first nanoparticles 41 each may be formed of a material including an oxygen hydrogen (OH) ligand. For example, the first nanoparticles 41 each may be formed of $SiO_2$ or ZnO. The first nanoparticles 41, for example, $SiO_2$ nanoparticles, each may be formed to have a size of about 200 nm to about 3 μm.

The second nanoparticles 43 are coupled to the surfaces of the first nanoparticles 41, and may have a size that is smaller than that of the first nanoparticles 41. The second nanoparticles 43 may be formed of, for example, GaN or β-$Ga_2O_3$.

Figure 3:
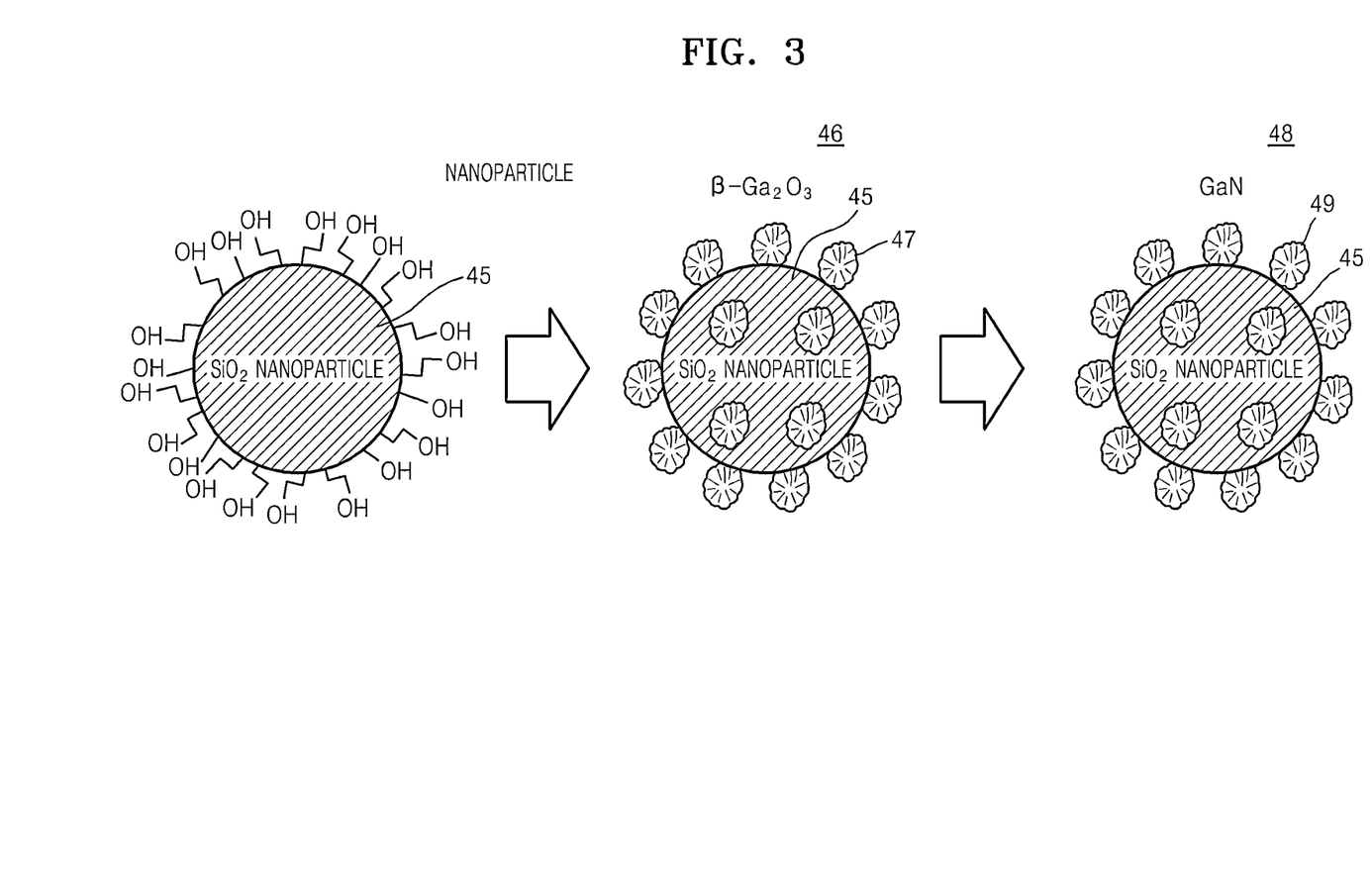
FIG. 3 is a diagram illustrating a process of forming a nanocomposite in which at least one $\beta$-$Ga_2O_3$ nanoparticle and at least one GaN nanoparticle is coupled on the surface of a $SiO_2$ nanoparticle.
Figure 4:
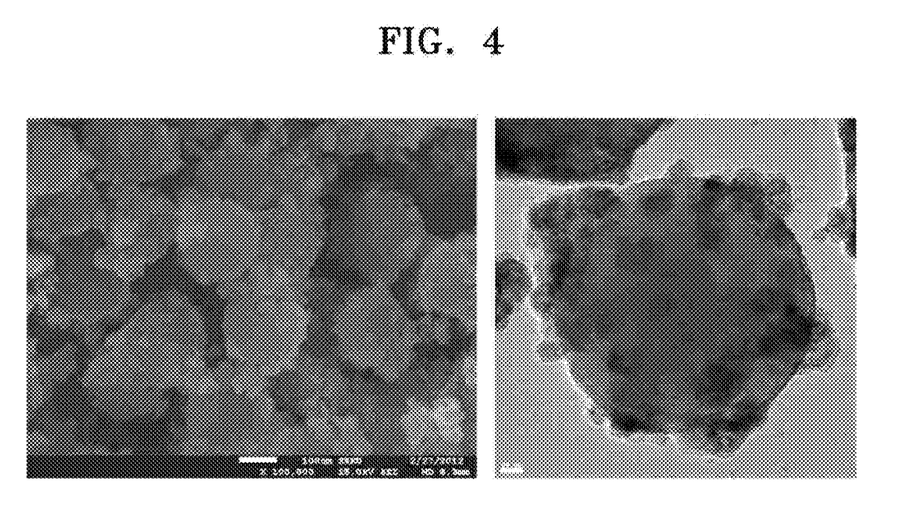
FIG. 4 is an image photograph of nanocomposites obtained through the process of FIG. 3.

FIG. 3 shows a process of forming nanocomposites 46 and 48 in which at least one β-$Ga_2O_3$ nanoparticle 47 or GaN nanoparticle 49 is coupled on the surface of a $SiO_2$ nanoparticle 45, respectively. FIG. 4 shows an image photograph of nanocomposites obtained through the process of FIG. 3.

Referring to FIGS. 3 and 4, in order to form the nanocomposites 46 and 48 in which the at least one β-$Ga_2O_3$ nanoparticle 47 or GaN nanoparticle 49 is coupled on the surface of the $SiO_2$ nanoparticle 45, any one of gallium nitrate and gallium chloride may be used as a solute, and any one of deionized water, ethanol, methanol, and propanol may be used as a solvent.

When the $SiO_2$ nanoparticle 45 and the gallium nitrate or gallium chloride solute are mixed with the solvent, the solute is coupled to an OH ligand of the $SiO_2$ nanoparticle 45, and thus, the nanocomposite 46 (that is, $SiO_2$ & β-$Ga_2O_3$ nanocomposite) having a structure in which the at least one β-$Ga_2O_3$ nanoparticle 47 is coupled on the surface of the $SiO_2$ nanoparticle 45 is obtained. The $SiO_2$ & β-$Ga_2O_3$ nanocomposite 46 may be powdered.

In order to form the dislocation control layer 30 illustrated in FIGS. 1 and 2, the $SiO_2$ & β-$Ga_2O_3$ nanocomposite 46 in which the at least one β-$Ga_2O_3$ nanoparticle 47 is coupled on the surface of the $SiO_2$ nanoparticle 45 may be used as the nanocomposites 40 illustrated in FIG. 2. In addition, in order to form the dislocation control layer 30 illustrated in FIGS. 1 and 2, the nanocomposite 48 (that is, $SiO_2$ & GaN nanocomposite) having a structure in which the at least one GaN nanoparticle 49 is coupled on the surface of the $SiO_2$ nanoparticle 45 may be used as the nanocomposites 40 illustrated in FIG. 2. That is, the $SiO_2$ & β-$Ga_2O_3$ nanocomposite 46 or the $SiO_2$ & GaN nanocomposite 48 may be used as the nanocomposites 40.

The $SiO_2$ & GaN nanocomposite 48 may be formed by heat-treating a powder of the $SiO_2$ & β-$Ga_2O_3$ nanocomposites 46 and nitriding the heat-treated $SiO_2$ & β-$Ga_2O_3$ nanocomposite 46 powder. The powder of the $SiO_2$ & β-$Ga_2O_3$ nanocomposites 46 may be heat-treated for about one hour to about ten hours at a temperature of about 800° C. to about 1000° C. In order to convert the heat-treated $SiO_2$ & β-$Ga_2O_3$ nanocomposite 46 into the $SiO_2$ & GaN nanocomposite 48, the heat-treated $SiO_2$ & β-$Ga_2O_3$ nanocomposite 46 may be nitrided for about one hour to about five hours in an $NH_3$ and $Ar/H_2$ atmosphere at a temperature of about 800° C. to about 1000° C. In example embodiments, the amount of the GaN nanoparticle 49 coupled on the surface of the $SiO_2$ nanoparticle 45 may be adjusted according to a mole ratio of Ga to $SiO_2$.

The right side of FIG. 3 shows a process of forming the $SiO_2$ & GaN nanocomposite 48 having a structure in which at least one GaN nanoparticle 49 is coupled on the surface of the $SiO_2$ nanoparticle 45 by nitriding the $SiO_2$ & $\beta$-$Ga_2O_3$ nanocomposite 46. The nanocomposites 40 should be distributed on the substrate 10 to form the dislocation control layer 30 on the substrate 10 by using the nanocomposites 40.

To distribute the nanocomposites 40 on the substrate 10 as a single layer, a solution including the nanocomposites 40, for example, the $SiO_2$ & GaN nanocomposites 48, is spin-coated on the substrate 10. The dislocation control layer 30 may be formed by drying the spin-coated solution. In example embodiments, deionized water, ethanol, methanol, toluene, or the like may be used as a solvent for the solution including the nanocomposites 40.

The amount of the $SiO_2$ & GaN nanocomposites 48 that are distributed on the substrate 10 may be adjusted by adjusting the amount of the $SiO_2$ & GaN nanocomposites 48 included in the solution (namely, a solute), and thus, the uniformity of the $SiO_2$ & GaN nanocomposites 48 that are distributed on the substrate 10 may be adjusted.

Figure 5:
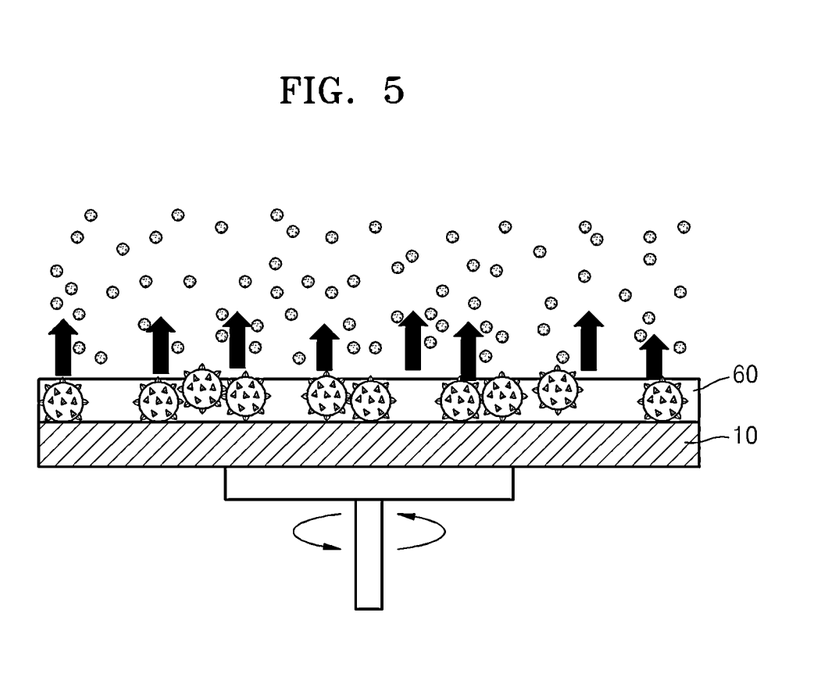
FIG. 5 is a diagram illustrating a spin coating process of distributing nanocomposites on a substrate.
Figure 6:
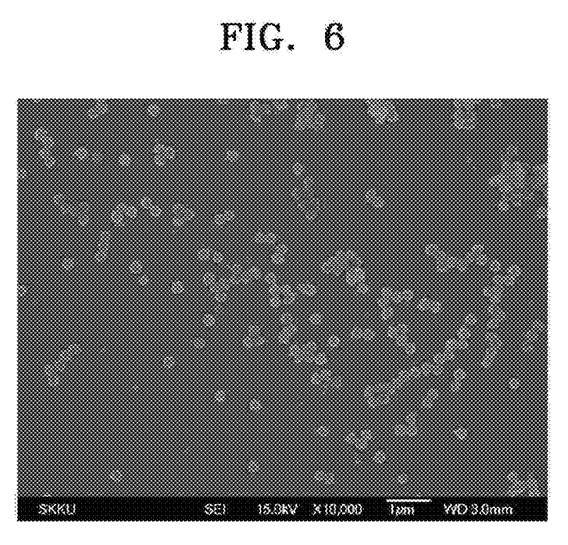
FIG. 6 is an image photograph of nanocomposites distributed on a substrate.

FIG. 5 shows a spin coating process of distributing the nanocomposites 40 on the substrate 10. FIG. 6 shows an image photograph of the nanocomposites 40 distributed on the substrate 10. Here, for convenience, a spin coating process using $SiO_2$ & GaN nanocomposites as the nanocomposites 40 is described as an example.

Referring to FIG. 5, a $SiO_2$ & GaN nanocomposites solution 60 may be spin-coated on the substrate 10 by mounting the substrate 10 on a sample supporter 15, sprinkling sufficient $SiO_2$ & GaN nanocomposites solution 60 (for example, about 20 ml to about 100 ml) on the substrate 10, and spinning the substrate 10. For example, deionized water may be used as a solvent of the $SiO_2$ & GaN nanocomposites solution 60. In FIG. 5, "A" indicates an evaporating solvent (for example, evaporating deionized water), and "B" indicates moisture of the evaporated solvent.

The density of the $SiO_2$ & GaN nanocomposites solution 60 that is spin-coated on the substrate 10 may be adjusted by adjusting an evaporating speed of the solvent and a capillary force "C" operating between solutes. To increase the extent of distribution, the number of spin coatings may be 1 to 5 times and a spin speed may be in the range of about 200 rpm to about 8000 rpm. The single layer deposition and uniformity of the $SiO_2$ & GaN nanocomposites may be adjusted through the spin speed and the number of spin coatings. For example, a $SiO_2$ & GaN nanocomposites single layer density may be made to be about 70 percent.

In a process of preparing the substrate 10 to form the dislocation control layer 30, the substrate 10 may be surface-treated to make a hydrophilic substrate. In order to change the substrate 10 into a hydrophilic substrate, the substrate 10 may be surface-treated for a given (or alternatively, predetermined) time, for example, for about 30 minutes, by using a solution obtained by mixing $H_2SO_4$, $H_2O_2$, and deionized water. A process of forming the dislocation control layer 30 by distributing the nanocomposites 40 may be performed on the surface-treated substrate 10, namely, the hydrophilic substrate.

Referring back to FIG. 1, as described above, the dislocation control layer 30 is formed on the prepared substrate 10, and the nitride semiconductor layer 50 may be grown on the dislocation control layer 30 using epitaxial growth. The nitride semiconductor layer 50 may be based on GaN.

Figure 7:
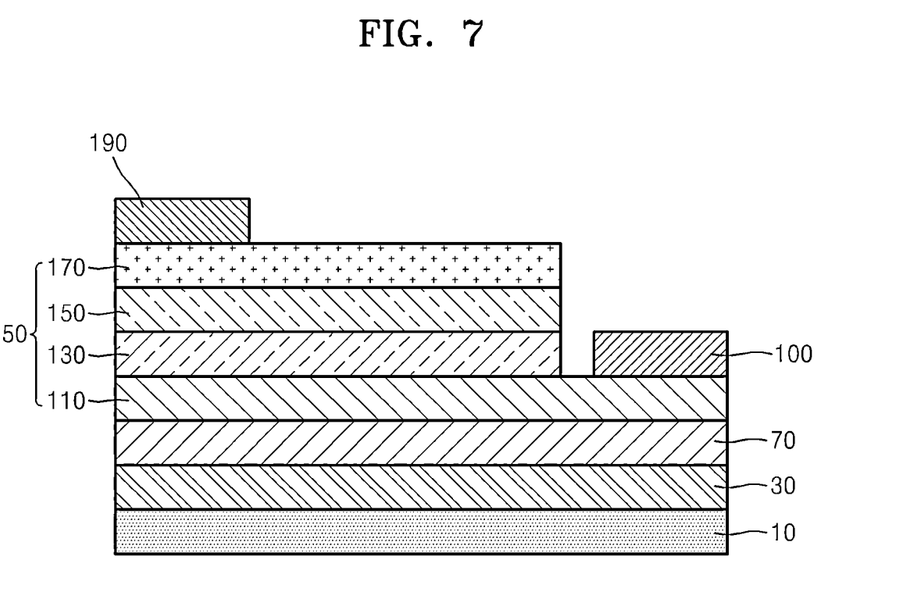
FIGS. 7 and 8 are cross-sectional views each illustrating a nitride semiconductor light-emitting device as an application example of the nitride semiconductor device of FIG. 1.
Figure 8:
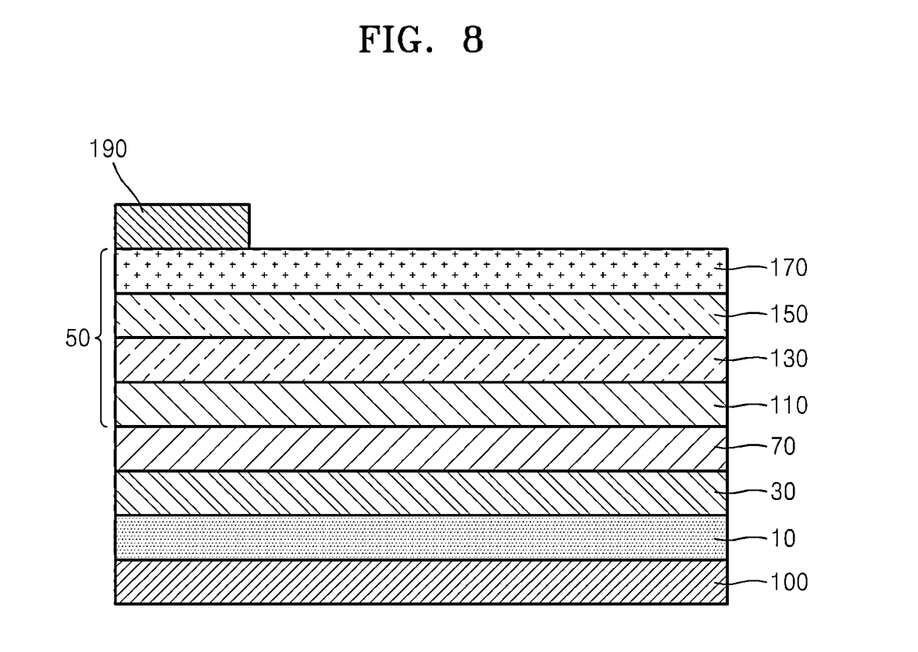

FIGS. 7 and 8 are cross-sectional views each illustrating a nitride semiconductor light-emitting device as an application example of the nitride semiconductor device according to the example embodiment. FIG. 7 illustrates a horizontal type nitride semiconductor light-emitting device, and FIG. 8 illustrates a vertical type nitride semiconductor light-emitting device.

Referring to FIGS. 7 and 8, the horizontal type nitride semiconductor light-emitting device of FIG. 7 and the vertical type nitride semiconductor light-emitting device of FIG. 8 each include a substrate 10, a dislocation control layer 30 disposed on the substrate 10, and a nitride semiconductor layer 50 disposed on the dislocation control layer 30. The nitride semiconductor layer 50 may include a first conductive type gallium nitride layer 110, an active layer 130 having a gallium nitride-based multilayer quantum well structure, and second conductive type gallium nitride layers 150 and 170 of which types are opposite to that of the first conductive type gallium nitride layer 110.

The horizontal type nitride semiconductor light-emitting device of FIG. 7 and the vertical type nitride semiconductor light-emitting device of FIG. 8 each further include first and second electrodes 100 and 190 for applying a current to generate light in the active layer 130. The horizontal type nitride semiconductor light-emitting device of FIG. 7 and the vertical type nitride semiconductor light-emitting device of FIG. 8 each may further include a buffer layer 70 between the substrate 10 and the nitride semiconductor layer 50, for example, between the dislocation control layer 30 and the first conductive type gallium nitride layer 110.

In the case of the horizontal type nitride semiconductor light-emitting device of FIG. 7, as illustrated in FIG. 7, a portion of the nitride semiconductor layer 50, for example, the first conductive type gallium nitride layer 110, is formed to be exposed, and the first electrode 100 and the second electrode 190 may be formed on the exposed surface of the first conductive type gallium nitride layer 110 and on the second conductive type gallium nitride layer 170, respectively.

In the case of the vertical type nitride semiconductor light-emitting device of FIG. 8, as illustrated in FIG. 8, the first electrode 100 may be formed on the back side of the substrate 10 and the second electrode 190 may be formed on the second conductive type gallium nitride layer 170.

The buffer layer 70 may be formed of, for example, at least one material selected from the group consisting of ZnO, BN, AlN, GaN, and $Al_{1-x}Ga_xN$.

The first conductive type gallium nitride layer 110 may be formed on the buffer layer 70. The first conductive type gallium nitride layer 110 may be an n-type gallium nitride layer, and may include an n-type gallium nitride single layer or n-type gallium nitride multiple layers grown while sequentially increasing or decreasing impurities for a n-type doping. For example, the first conductive type gallium nitride layer 110 may be an n-GaN layer grown while grading the amount of silicon (Si) doping to form a p-n junction.

In the active layer 130 having the multilayer quantum well structure, a plurality of $In_{1-x}Ga_xN$ ($0<x \leq 1$) layers in which at least two layers have different indium (In) contents may be alternately stacked on the first conductive type gallium nitride layer 110, namely, the n-type gallium nitride layer.

The second conductive type gallium nitride layers 150 and 170 may be formed on the active layer 130. Each of the second conductive type gallium nitride layers 150 and 170 may be a p-type gallium nitride layer, and may include a p-type gallium nitride layer to be two step layers of which degrees of impurity doping are different from each other. For example, the second conductive type gallium nitride layers 150 and 170 may be a β-GaN layer formed of two step layers to form a p-n junction and reduce contact resistance. The p-type gallium nitride layer including the two step layers to reduce contact resistance may be formed to have a single layer or a plurality of layers while adjusting, for example, sequentially decreasing or increasing, the density of magnesium (Mg) to have ohmic contact resistance and high hole density.

In the case where the first conductive type gallium nitride layer 110 is an n-type gallium nitride layer and the second conductive type gallium nitride layers 150 and 170 are p-type gallium nitride layers, for example, a p-type gallium nitride layer including two step layers, the first electrode 100 may be an n-type electrode and the second electrode 190 may be a p-type electrode.

The first conductive type gallium nitride layer 110, the active layer 130, and the second conductive type gallium nitride layers 150 and 170 may be sequentially formed on the substrate 10, on which the dislocation control layer 30 has been formed, by using metal organic chemical vapor deposition (MOCVD), molecular beam epitaxy (MBE), hydride vapor phase epitaxy (HVPE), or the like. For example, in a state in which the dislocation control layer 30 has been formed on the substrate 10 treated by a mixture of sulfuric acid and hydrogen peroxide, the buffer layer 70, the first conductive type gallium nitride layer 110, the active layer 130, and the second conductive type gallium nitride layers 150 and 170 may be sequentially stacked by using the MOCVD.

Although the nitride semiconductor light-emitting device, which is an application example of the nitride semiconductor device according to the example embodiment, has a stack structure of FIG. 7 or FIG. 8, example embodiments are not limited thereto. The nitride semiconductor light-emitting device according to an example embodiment includes the substrate 10, the dislocation control layer 30 disposed on the substrate 10, and the nitride semiconductor layer 50 disposed on the dislocation control layer 30, and a stack structure and a structure material of the nitride semiconductor layer 50 may be variously changed.

As described above, according to the nitride semiconductor device according to the example embodiment and the method of manufacturing the nitride semiconductor device, a high-quality nitride thin film, for example, a high-quality GaN thin film, may be grown and may be applied for manufacturing a horizontal or vertical nitride semiconductor light-emitting device.

That is, in the LEO method, which includes forming a $SiO_2$ or $Si_3N_4$ mask pattern and growing a nitride thin film, for example, a GaN thin film by using the $SiO_2$ or $Si_3N_4$ mask pattern, and the Pendeo method which uses re-growth, a high-quality nitride thin film, for example, a high-quality GaN thin film, may be grown by minimizing or reducing physical damage on the substrate 10, which occurs during etching and grinding processes, and the deterioration of device characteristics due to impurities, and reproducibility may be maximized or increased by simplifying processes.

Accordingly, the uniformity of the device characteristics may be maintained, and the quality of the light-emitting device may be increased, thereby improving device reliability. A light efficiency of a light-emitting device may be represented with internal quantum efficiency and external quantum efficiency, and the internal quantum efficiency is determined according to a design or quality of the active layer 130 and the control of defects that occur in the substrate 10. Thus, by forming the dislocation control layer 30 by using the nanocomposites 40 (for example, the $SiO_2$ & GaN nanocomposites 48) having a structure in which the second nanoparticle 43 is coupled on the surface of the first nanoparticle 41, defects may be fundamentally removed or controlled, and thus, a device having an improved internal quantum efficiency may be obtained.

It should be understood that example embodiments described therein should be considered in a descriptive sense only and not for purposes of limitation. Descriptions of features or aspects within each embodiment should typically be considered as available for other similar features or aspects in other embodiments.

What is claimed is:

1. A nitride semiconductor device comprising:
   a dislocation control layer on a substrate, the dislocation control layer including a nanocomposite of a first nanoparticle made of a first material and at least one second nanoparticle made of a second material; and
   a nitride semiconductor layer on the dislocation control layer,
   wherein the first material includes an oxygen hydrogen (OH) ligand.

2. The nitride semiconductor device of claim 1, wherein the nanocomposite includes the at least one second nanoparticle coupled to the first nanoparticle.

3. The nitride semiconductor device of claim 1, wherein the first material is any one of $SiO_2$ and ZnO.

4. The nitride semiconductor device of claim 3, wherein the second material is any one of GaN and $β-Ga_2O_3$, and the at least one second nanoparticle is coupled to a surface of the first nanoparticle.

5. The nitride semiconductor device of claim 1, wherein the first nanoparticle is a $SiO_2$ nanoparticle and the at least one second nanoparticle is one of a GaN nanoparticle and a $β-Ga_2O_3$ nanoparticle coupled to the $SiO_2$ nanoparticle.

6. The nitride semiconductor device of claim 5, wherein the $SiO_2$ nanoparticle has a size in a range of about 200 nm to about 3 μm.

7. The nitride semiconductor device of claim 1, wherein the substrate includes any one of a sapphire substrate, a silicon substrate, and a silicon carbide substrate.

8. The nitride semiconductor device of claim 1, wherein
   the nitride semiconductor layer includes a first conductive type gallium nitride layer, an active layer having a gallium nitride-based multilayer quantum well structure, and at least one second conductive type gallium nitride layer having a type opposite to that of the first conductive type gallium nitride layer;
   a first electrode is on a surface of one of the first conductive type gallium nitride layer and a substrate;
   a second electrode is on a surface of the at least one second conductive type gallium nitride layer; and
   the first electrode and the second electrode are configured to apply a current to generate light in the active layer.

9. The nitride semiconductor device of claim 8, further comprising:
   a buffer layer between the substrate and the nitride semiconductor layer.

10. The nitride semiconductor device of claim 9, wherein the buffer layer includes at least one of ZnO, BN, AlN, GaN, and $Al_{1-x}Ga_xN$.

11. A method of manufacturing a nitride semiconductor device, the method comprising:
    forming a dislocation control layer on a substrate, the forming a dislocation control layer including forming a nanocomposite including a first nanoparticle made of a first material and at least one second nanoparticle made of a second material; and growing a nitride semiconductor layer on the dislocation control layer using epitaxial growth,
wherein the first material includes an oxygen hydrogen (OH) ligand.

12. The method of claim 11, wherein the forming a dislocation control layer includes spin-coating a solution including the nanocomposite on the substrate to distribute the nanocomposite on the substrate.

13. The method of claim 12, further comprising:
surface-treating the substrate to make a hydrophilic substrate.

14. The method of claim 13, wherein the surface-treating is performed for a given time using a solution obtained by mixing $H_2SO_4$, $H_2O_2$, and deionized water.

15. The method of claim 12, wherein the spin-coating includes using any one of deionized water, ethanol, methanol, and toluene as a solvent.

16. The method of claim 11, wherein the forming a nanocomposite includes coupling the at least one second nanoparticle to a surface of the first nanoparticle, the at least one second nanoparticle including one of a GaN nanoparticle and a $\beta$-$Ga_2O_3$ nanoparticle, and the first nanoparticle including a $SiO_2$ nanoparticle.

17. The method of claim 16, wherein heat-treating the at least one $\beta$-$Ga_2O_3$ nanoparticle coupled to the surface of the $SiO_2$ nanoparticle forms a $SiO_2$ & $\beta$-$Ga_2O_3$ nanocomposite powder, and the forming a nanocomposite includes nitriding the heat-treated $SiO_2$ & $\beta$-$Ga_2O_3$ nanocomposite powder.

18. The method of claim 11, wherein the forming a dislocation control layer includes using any one of gallium nitrate and gallium chloride as a solute to form the nanocomposite.

19. The method of claim 18, wherein the forming a dislocation control layer includes using any one of deionized water, ethanol, methanol, and propanol as a solvent to form the nanocomposite.

* * * * *